United States Patent
Ju

(10) Patent No.: US 9,941,017 B1
(45) Date of Patent: Apr. 10, 2018

(54) ANTIFUSE ONE-TIME PROGRAMMABLE SEMICONDUCTOR MEMORY

(71) Applicant: Donghyuk Ju, San Jose, CA (US)

(72) Inventor: Donghyuk Ju, San Jose, CA (US)

( * ) Notice: Subject to any disclaimer, the term of this patent is extended or adjusted under 35 U.S.C. 154(b) by 0 days.

(21) Appl. No.: 15/482,682

(22) Filed: Apr. 7, 2017

Related U.S. Application Data

(60) Provisional application No. 62/459,965, filed on Feb. 16, 2017.

(51) Int. Cl.
*G11C 17/16* (2006.01)
*G11C 17/18* (2006.01)
*H01L 27/112* (2006.01)

(52) U.S. Cl.
CPC ........... *G11C 17/18* (2013.01); *G11C 17/16* (2013.01); *H01L 27/11206* (2013.01)

(58) Field of Classification Search
CPC ..................................... G11C 17/16
USPC ..................................... 365/225.7
See application file for complete search history.

(56) References Cited

U.S. PATENT DOCUMENTS

| | | | | |
|---|---|---|---|---|
| 4,876,220 A | * | 10/1989 | Mohsen | ............ H01L 21/76886 257/E21.591 |
| 4,881,114 A | * | 11/1989 | Mohsen | ............ H01L 21/76886 257/530 |
| 6,015,748 A | * | 1/2000 | Kim | ............ H01L 27/105 257/E21.645 |
| 6,611,040 B2 | | 8/2003 | Gelsomini et al. | |
| 7,102,951 B2 | | 9/2006 | Paillet et al. | |
| 7,110,278 B2 | | 9/2006 | Keshavarzi et al. | |
| 7,656,738 B2 | | 2/2010 | Namekawa | |
| 7,678,620 B2 | | 3/2010 | Hoefler | |
| 7,755,162 B2 | | 7/2010 | Kurjanowicz et al. | |
| 8,258,586 B1 | | 9/2012 | Mitchell et al. | |
| 8,330,189 B2 | | 12/2012 | Luan et al. | |
| 8,476,157 B2 | | 7/2013 | Lung | |
| 9,406,397 B1 | | 8/2016 | Ju | |
| 2003/0227056 A1 | * | 12/2003 | Wang | ............ H01L 21/84 257/347 |
| 2008/0175060 A1 | * | 7/2008 | Liu | ............ G11C 11/404 365/185.18 |
| 2011/0254122 A1 | * | 10/2011 | Noda | ............ H01L 23/5252 257/530 |
| 2011/0255327 A1 | * | 10/2011 | Schmitt | ............ G11C 17/16 365/104 |
| 2011/0312169 A1 | * | 12/2011 | Kurjanowicz | ......... G11C 17/16 438/585 |
| 2015/0069377 A1 | * | 3/2015 | Rabkin | ............ H01L 27/1225 257/43 |

\* cited by examiner

*Primary Examiner* — Hoai V Ho
*Assistant Examiner* — Jay Radke

(57) ABSTRACT

An antifuse one-time programmable (OTP) semiconductor memory comprises a PN junction diode formed in an active area of a semiconductor substrate proximate metal-oxide-semiconductor (MOS) capacitor wherein MOS gate conductor and MOS channel region are of the same conductivity type. A vertical bipolar junction transistor (BJT) is present in each cell, comprising said PN junction diode and a semiconductor layer below said PN junction diode. In a programmed cell, BJT emitter, base and collector are connected to the bit line, word line and common collector terminal, respectively. In an unprogrammed cell, BJT is an open-base BJT.

6 Claims, 10 Drawing Sheets

ANTIFUSE ONE-TIME PROGRAMMABLE SEMICONDUCTOR MEMORY

CROSS REFERENCE TO RELATED APPLICATIONS

This application claims the benefit of U.S. provisional application No. 62/459,965 filed on Feb. 16, 2017.

FIELD OF THE INVENTION

The present invention relates generally to semiconductor memory, and more specifically, to antifuse embedded one-time programmable memory.

BACKGROUND OF THE INVENTION

A fuse is a device that is initially in a conductive state and becomes non-conductive when blown. In contrast, an antifuse is non-conductive in the native unprogrammed state and becomes conductive when programmed, hence the name antifuse. Antifuse used in integrated circuits is commonly constructed with a thin dielectric layer sandwiched between two conductors. To program an antifuse, a high voltage is applied between the two conductors. This leads to a physical and permanent breakdown of the thin dielectric layer and the formation of a current conduction path between the two conductors. Antifuse can thus be used as a memory element. Programmed state of an antifuse represents data "1" and unprogrammed state "0" or vice versa. Once programmed, antifuse memory cannot revert to unprogrammed state, i.e., it is a one-time programmable (OTP) memory. Antifuse retains conductive or non-conductive state even after the power is turned off, rendering the data non-volatile. As such, antifuse memory is a non-volatile OTP memory.

Use of antifuse OTP memory includes storing program codes, security codes and trimming data of analog circuits in various integrated circuits. Its application includes consumer, industrial, automotive electronics, and internet-of-things (IoT). For these applications, an antifuse OTP memory capable of high-speed and reliable operation with high-density and low-power consumption is desired.

Antifuse OTP memory is one of the several semiconductor OTP memory types available today, namely, electrical fuse, mask read-only memory (ROM), floating gate memory and antifuse memory. Due to its small bit cell size, good reliability, user programmability and easy integration and scaling with the complementary metal-oxide-semiconductor (CMOS) process, popularity of antifuse memory as an OTP memory embedded in integrated circuit chips is increasing. The mainstream antifuse OTP memory manufactured today uses metal-oxide-semiconductor (MOS) capacitor as the antifuse element. In the conventional one-transistor one-capacitor (1T1C) antifuse memory cell, MOS capacitor is connected to an access device, typically a metal-oxide-semiconductor field-effect-transistor (MOSFET) to form an antifuse memory bit cell. This is schematically illustrated in FIG. 1A, a prior art. In FIG. 1A, PL is the program line where a high voltage is applied during programming, WL is the word line and BL is the bit line of the memory cell. FIG. 1B illustrates an exemplary cross-sectional view of 1T1C cell from a standard CMOS process. Starting material in FIG. 1B is the P-type silicon substrate 100. Source/drain 102, gate dielectric 104 and gate polysilicon 106 form the access transistor. MOS capacitor shown inside a circle in FIG. 1A and FIG. 1B comprises gate polysilicon 106, gate dielectric 104 and the channel region, which is the silicon substrate 100. MOS capacitor is connected to the access transistor by the MOSFET drain diffusion 102 on one end, and open-circuited at the other end with the gate polysilicon terminated on shallow trench isolation (STI).

In a standard CMOS process, source/drain and gate of a MOSFET are of the same conductivity type and the MOSFET channel region, i.e., silicon under the gate polysilicon is of the opposite conductivity type. This is seen in FIG. 1B, a cross-section view of the conventional 1T1C cell, wherein the source/drain 102 and gate 106 of the access transistor are N-type and the channel region 100 is P-type. Likewise, MOS capacitor shown in FIG. 2A, reproduced from FIG. 1B, has the gate 206 and the source/drain 202 doped in N-type and the channel region 200 under the gate polysilicon 206 doped in P-type. FIG. 2A highlights the current conduction path 205 formed at the ruptured spot in the gate dielectric 204 is not ohmic but takes the form of a PN junction diode because of the opposite conductivity types of the gate polysilicon 206 and capacitor channel 200.

Referring again to FIG. 2A, it should be pointed out the diode created at the connection 205 in a standard CMOS process is a polysilicon-to-silicon diode. Because of the low mobility of electrons and holes in polysilicon and the high interface trap density at the polysilicon grain boundaries, the electrical characteristics of polysilicon-to-silicon diode may be substantially worse than those of a PN junction diode formed in the single-crystal silicon substrate. FIG. 2B shows DC equivalent circuit of a PN junction diode wherein $R_f$ 210 is the diode resistance in the forward mode, $R_r$ 212 is the diode resistance in the reverse mode and the diode symbol 214 represents an ideal diode for which $R_f$ is zero and $R_r$ is infinity. Diodes formed in the single-crystal silicon substrate are, though not ideal, high quality diodes with low $R_f$ values as low as a few ohms and very high $R_r$ values well above $1 \times 10^{12}$ ohms. By contrast, $R_f$ of a polysilicon-to-silicon diode may be much higher and $R_r$ may be much lower as much as by several orders of magnitude. Furthermore, uniformity of polysilicon-to-silicon diodes may be poor, causing a large variation of $R_f$ and $R_r$ among diodes. FIG. 3 schematically illustrates the current-vs.-voltage characteristics of polysilicon-to-silicon diodes and diodes formed in the silicon substrate. Forward currents of polysilicon-to-silicon diodes 304 are lower and more scattered than those of diodes formed in the silicon substrate 302. For example, the forward currents of the polysilicon-to-silicon diodes may range from 10 micro ampere (uA) to 500 uA at a forward bias voltage of 1 volt (V) when the forward current of the diodes formed in the silicon substrate is 1 milli ampere (mA). Reverse leakage currents of polysilicon-to-silicon diodes 308 are higher and more scattered than those of diodes formed in the silicon substrate 306. For example, reverse leakage currents of the polysilicon-to-silicon diodes may range from 10 pico ampere (pA) to 1 nano ampere (nA) at a forward bias voltage of 1.8V when the reverse leakage current of the diodes formed in the silicon substrate is 10 femto ampere (fA). It is to be mentioned since reverse leakage currents 306 and 308 are much smaller than the forward currents 302 and 304, different scales are used in FIG. 3 for the positive Y axis and for the negative Y axis in order to show and compare the forward and reverse currents of these diodes in a single plot. The shortcomings of polysilicon-to-silicon diodes shown in FIG. 3 are an inherent limitation to building a high-performance high-density antifuse OTP memory array.

An antifuse OTP memory array featuring a small bit cell has been disclosed in a prior art found in U.S. Pat. No. 8,330,189. The OTP memory therein uses polysilicon-tosilicon diode as the bit-cell access device and has a cross-point array architecture. The buried bit-line cell structure employed therein enables a small bit cell size and cross-point array architecture. However, it causes a high and varying bit-cell series resistance among bit cells connected to the same metal bit line. In addition, use of polysilicon-to-silicon diode as the access device makes it more challenging to bring cell-to-cell variation under control. The problem of a high and varying series resistance stemming from the buried bit-line cell of U.S. Pat. No. 8,330,189 is solved in U.S. Pat. No. 9,406,397 wherein each bit cell is directly connected to the metal bit line. However, use of polysilicon-to-silicon diode as access device and cell-to-cell variation associated with it may limit its merit. To build a high-performance and high-density antifuse OTP memory array, it is crucial to have a tight control of electrical characteristics among cells. The objective of the present invention is to eliminate the shortcomings inherent in the prior arts, specifically a large cell-to-cell variation of the electrical characteristics, and thereby realize a high-performance and high-density antifuse OTP memory.

BRIEF SUMMARY OF THE INVENTION

An antifuse OTP memory bit cell comprises a MOS capacitor and a PN junction diode formed next to the MOS capacitor. The gate electrode of the MOS capacitor and MOS channel, i.e., a semiconductor region under the MOS gate electrode are of the same conductivity type. In a programmed cell, an ohmic conductive path connects the gate electrode of the MOS capacitor through the ruptured gate dielectric to MOS channel. In each cell, a vertical bipolar junction transistor (BJT) is present comprising said PN junction diode and a semiconductor layer below said PN junction diode. The gate electrode of the MOS capacitor is the word line and also acts as the base terminal of the BJT. The metal bit line is the BJT emitter terminal. In a programmed cell, BJT emitter, base and collector are connected to the bit line, word line and common collector terminal, respectively. In an unprogrammed cell, BJT base is not connected to the word line, and is an open-base BJT.

DETAILED DESCRIPTION OF THE INVENTION

Figure 1A:
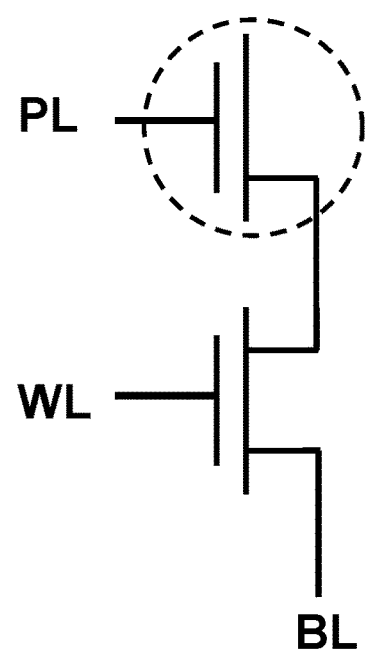
FIG. 1A is a schematic drawing of the one-transistor one-capacitor (1T1C) antifuse OTP memory cell found in the prior art using MOS capacitor as antifuse element.
Figure 1B:
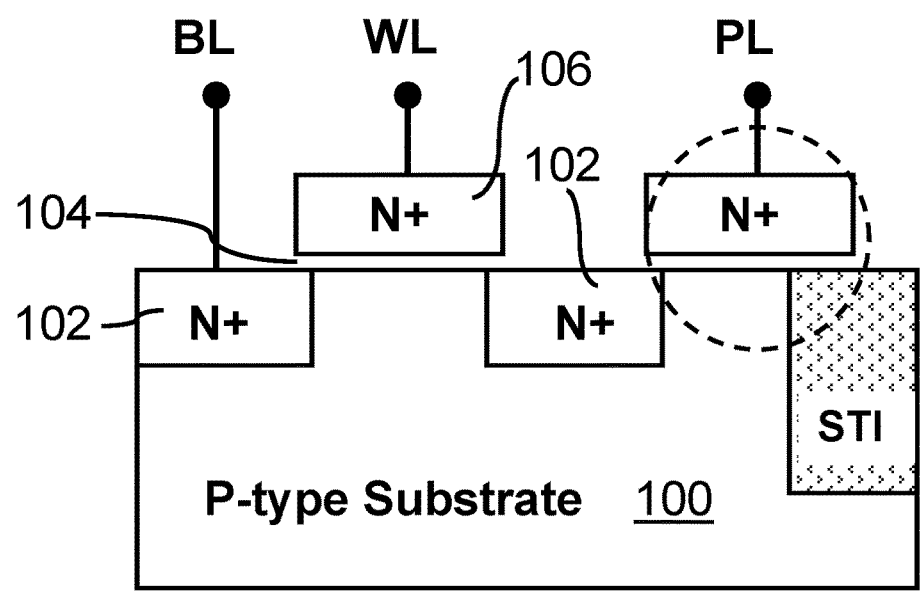
FIG. 1B is a cross-sectional view of the one-transistor one-capacitor (1T1C) antifuse OTP memory cell of FIG. 1A.
Figure 2A:
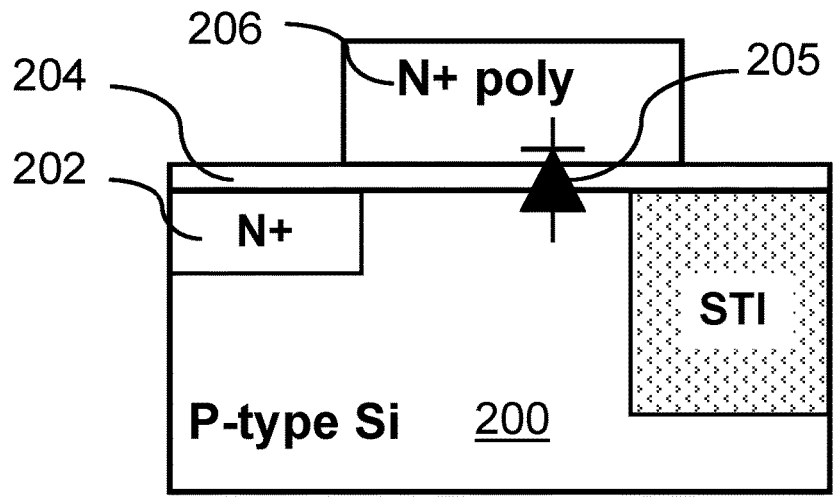
FIG. 2A is a cross-sectional view of a MOS capacitor in the 1T1C cell fabricated in a standard CMOS process highlighting a formation of a polysilicon-to-silicon diode in a programmed cell.
Figure 2B:
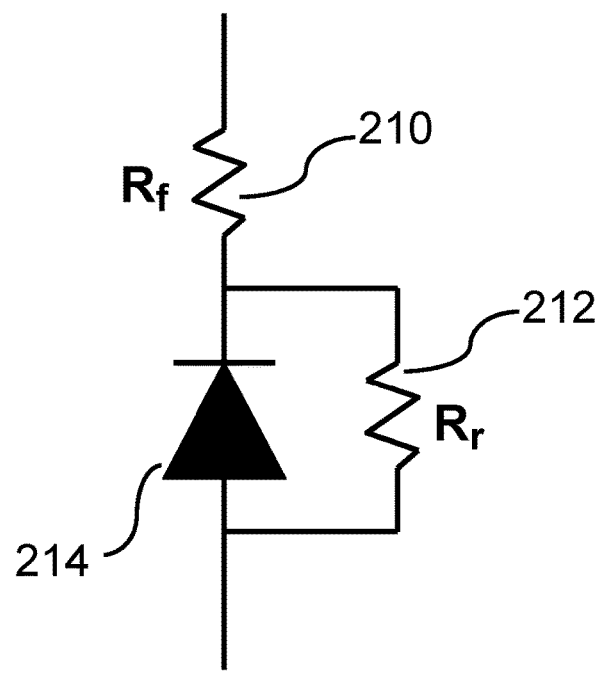
FIG. 2B is a DC equivalent circuit of a PN junction diode showing the forward and reverse resistances $R_f$ and $R_r$, respectively, connected to an ideal diode.
Figure 3:
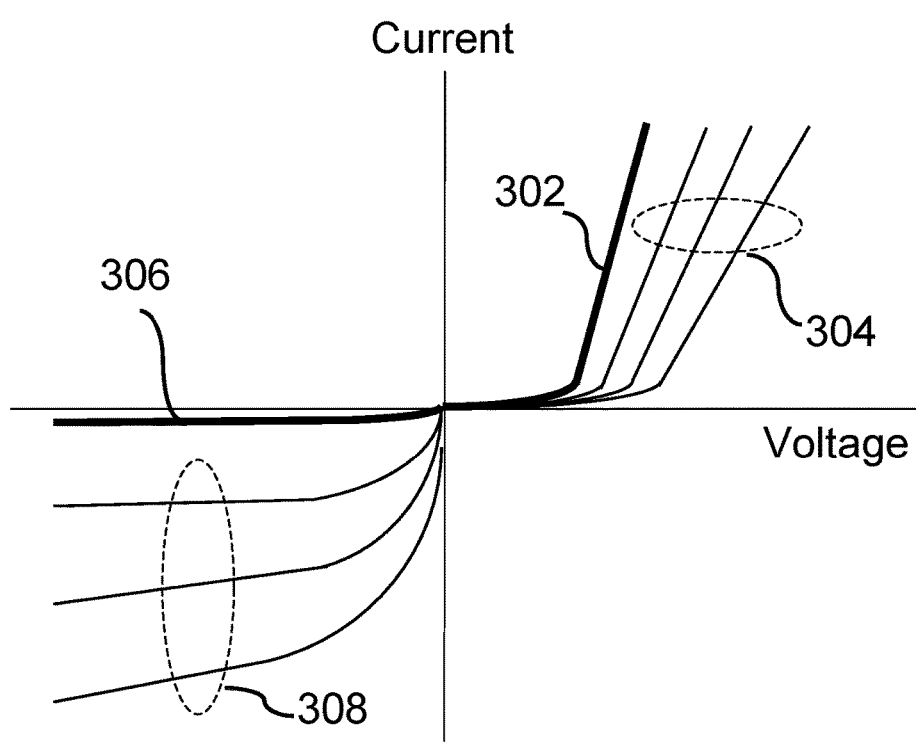
FIG. 3 is a schematic plot of the diode current-vs.-voltage characteristics for diodes formed in the silicon substrate and of polysilicon-to-silicon diodes.
Figure 4:
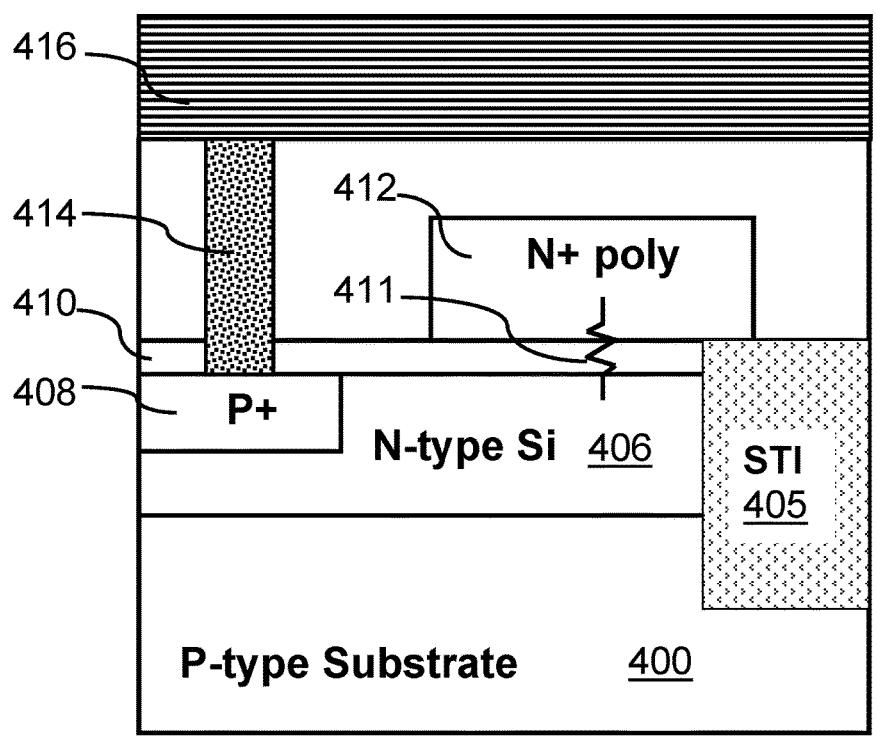
FIG. 4 is a cross-sectional view of an antifuse OTP memory bit cell according to one exemplary embodiment of the present invention.

FIG. 4 shows a cross-sectional view of an exemplary embodiment of the present invention. The semiconductor substrate 400 in this example is P-type silicon. All features in FIG. 4, except for the N-type layer 406, are the result of a standard CMOS process. Isolation 405 shown herein is shallow trench isolation (STI) but it can be local oxidation of silicon (LOCOS) or other types of isolation structure. The N-type region 406 acts as the bottom electrode of antifuse MOS capacitor and is also the base of a vertical PNP BJT. The N-type region 406 is shallower than the isolation 405 to ensure cell-to-cell isolation. In a standard CMOS process, isolation 405 is typically 0.3 micrometer (um) to 0.4 um deep and N-type region 406 can be about 0.25 um deep. Gate dielectric 410 is deposited on the wafer surface, followed by the deposition and patterning of gate polysilicon 412. Gate dielectric 410 can be silicon dioxide ($SiO_2$), silicon nitride ($Si_3N_4$), silicon oxynitride ($SiO_xN_y$) or high-k dielectric such as hafnium dioxide ($HfO_2$). Gate polysilicon 412 is doped into N-type, same type as the bottom electrode 406 of MOS capacitor, by $N^+$ source/drain implant for N-channel MOSFET. $P^+$ layer 408 is formed inside the N-type region 406 by $P^+$ source/drain implant for P-channel MOSFET. Subsequent fabrication of the memory cell proceeds with the standard CMOS processing steps, with contact 414 formed on the $P^+$ layer 408 and deposition and patterning of the first-level metal 416. Only those process steps salient to describing the memory cell of this embodiment are mentioned herein and the routine steps in a standard CMOS process known to those of ordinary skill in the art are not shown and described so as to avoid unnecessary obfuscation. For example, not shown in FIG. 4 are silicide films formed on the surfaces of $P^+$ layer 408 and gate polysilicon 412 and spacer dielectric formed on the sidewalls of gate polysilicon.

Referring to FIG. 4, it is to be noted the PN junction diode made of the $P^+$ layer 408 and N-type region 406 is formed in the single-crystal semiconductor substrate, not a polysilicon-to-silicon diode. Furthermore, $P^+$ layer 408, N-type region 406 and P-type substrate 400 form the emitter, base and collector, respectively, of a vertical PNP BJT, which is used as the bit cell access device. During programming, gate dielectric 410 ruptures and an ohmic conductive path 411 is created between $N^+$ gate polysilicon 412 and N-type region 406. In a programmed cell, BJT base 406 is connected to word line 412. In an unprogrammed cell, BJT base 406 is not connected to word line 412 and therefore it is an open-base BJT. The fact that the ohmic conductive path 411 resides in the BJT base, not in the emitter, is advantageous for a tight control of cell-to-cell variation. This will be explained in more detail later with reference to FIG. 7B.

A memory cell of FIG. 4 is programmed by applying a positive voltage $V_{prog}$ to the selected bit line 416 and grounding the selected word line 412 and P-type substrate 400. Under this bias condition, the floating N-type layer 406 charges up to a voltage close to $V_{prog}$ and a large voltage drop appears across the gate dielectric 410 of MOS capacitor. The resulting high electric field in the gate dielectric leads gate dielectric to breakdown. During programming, unselected bit lines are grounded and unselected word lines are biased to $V_{prog}$ or left floating. A cell is read by forward biasing the base-emitter junction with a positive voltage $V_{read}$, for example 1V, applied to the bit line 416 and 0V applied to the word line 412 of the selected cell, then sensing the emitter current flowing into the bit line 416. During read, unselected bit lines are grounded and unselected word lines are biased to a voltage higher than $V_{read}$, for example 1.8V, or left floating.

Figure 5:
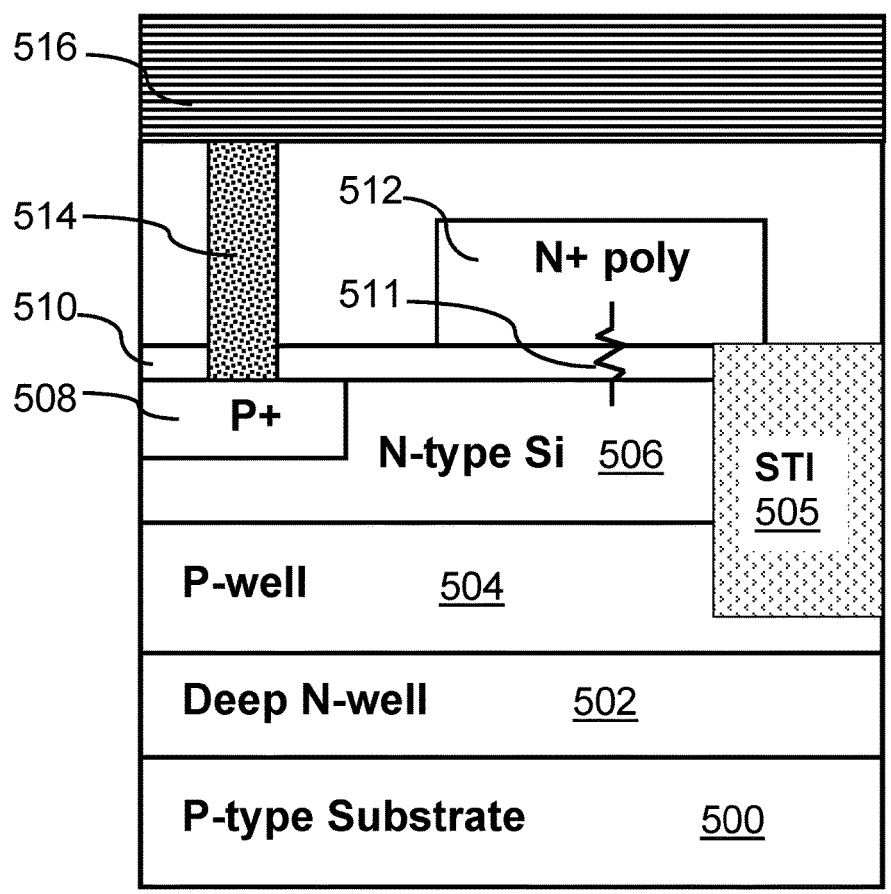
FIG. 5 is a cross-sectional view of an antifuse OTP memory bit cell according to another embodiment of the present invention.

FIG. 5 shows a cross-sectional view of another exemplary embodiment of the present invention. Memory cell in FIG. 5 is structurally the same as in FIG. 4, except for the presence of deep N-well 502 and P-well 504. All other features in FIG. 5, i.e., 500, 505, 506, 508, 510, 511, 512, 514 and 516 are the same as 400, 405, 406, 408, 410, 411, 412, 414 and 416 in FIG. 4, respectively. Because P-well 504 is isolated from the P-type substrate 500 by deep N-well 502 it can be biased to its own voltage or left floating, independent of the substrate voltage, which is typically 0V.

Figure 6:
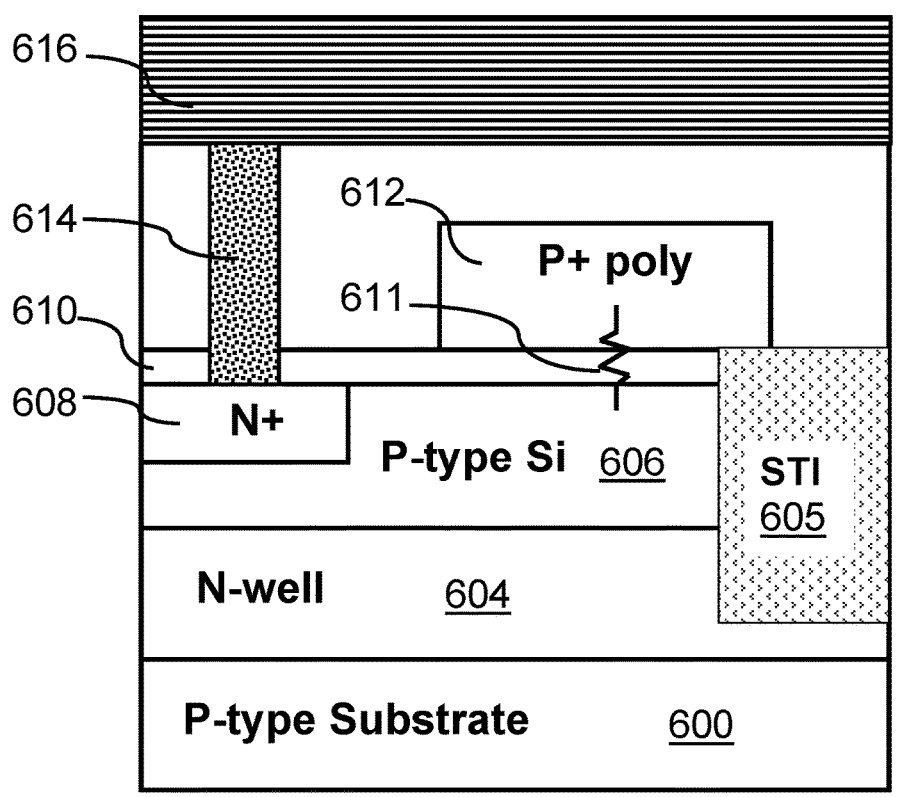
FIG. 6 is a cross-sectional view of an antifuse OTP memory bit cell according to yet another embodiment of the present invention.

FIG. 6 shows a cross-sectional view of yet another exemplary embodiment of the present invention. The semiconductor substrate in FIG. 6 is P-type silicon 600, same as in FIG. 4 and FIG. 5. The difference is that the memory cell in FIG. 6 is constructed on N-well 604, whereas the memory cells in FIG. 4 and FIG. 5 are constructed on P-type substrate or P-well. As such, features of the memory cell in FIG. 6, —P-type region 606 N$^+$ layer 608 and P$^+$ gate polysilicon 612—are of opposite conductivity types to corresponding features 406, 408, 412 in FIGS. 4 and 506, 508, 512 in FIG. 5. In FIG. 6, N$^+$ layer 608, P-type region 606 and N-well 604 form a vertical NPN BJT, which is used as access device. The bottom junction of N-well 604 with P-type substrate 600 is deeper than STI 605 so that N-well 604 serves as the common collector of memory cells in the array. The top junction of N-well 604 bordering the P-type region 606 is shallower than STI 605 to ensure isolation of P-type region 606 from neighboring P-type regions. N$^+$ layer 608 is the BJT emitter and is connected to the metal bit line 616 through contact 614. P-type region 606 is the BJT base. In a programmed cell, BJT base is connected to P$^+$ gate polysilicon 612, i.e., word line, through ohmic conductive path 611 formed in the gate dielectric 610. In a standard CMOS process, there may exist a number of N-wells, such as low-voltage N-well, high-voltage N-well, and deep N-well and one or a combination of N-wells existing in a standard process may be suitable to create N-well 604. Likewise, there may exist a number of P-type implants in a standard CMOS process, such as N-channel threshold voltage ($V_t$) implant for core transistors, N-channel $V_t$ implant for input/output (I/O) transistors, and N-channel $V_t$ implant for static random access memory (SRAM). It may be possible P-type region 606 is created with one of these N-channel $V_t$ implants existing in a standard CMOS process or combination thereof. For an optimal BJT performance, an extra P-type implant may used to create P-type region 606.

Referring to FIG. 6, a memory cell is programmed by applying a positive voltage $V_{prog}$ to the word line 612 and grounding the bit line 616 of the selected cell. Under this bias condition, the P-type region 606 remains close to 0V and a large voltage drop appears across the gate dielectric of MOS capacitor in the cell. The resulting high electric field in the gate dielectric leads gate dielectric to breakdown. During programming, it is desirable to suppress bipolar transistor action of the NPN BJT so that the programming current flows between the word line and bit line through gate dielectric during the rupture process. To suppress the bipolar transistor action, N-well 604 is left floating during programming. Unselected bit lines and word lines are left floating and grounded, respectively, during programming, or $V_{prog}$ can be applied to the unselected bit line. A cell is read by forward biasing the BJT base-emitter junction with a positive voltage $V_{read}$, for example 1V, applied to the word line 612 and 0V applied to the bit line 616 of the selected cell, then sensing the emitter current flowing out of the bit line 616. During read, unselected word lines are grounded and unselected bit lines are biased to a voltage higher than $V_{read}$, for example 1.8V, or left floating. For an unprogrammed cell, the emitter current is very low because there is no bipolar transistor action in the cell.

Figure 7A:
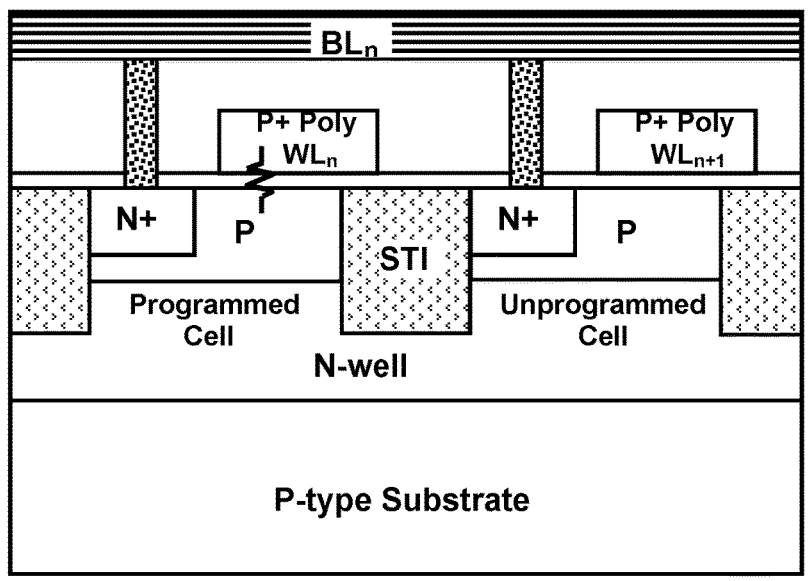
FIG. 7A is a cross-sectional view of two antifuse OTP memory bit cells according to FIG. 6, one representing a programmed cell and the other representing an unprogrammed cell.
Figure 7B:
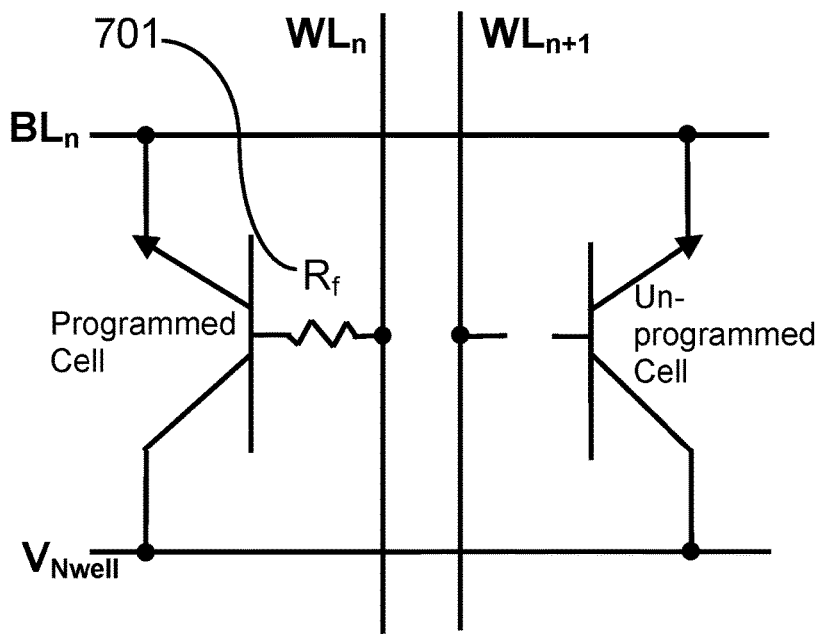
FIG. 7B is a schematic drawing of the two bit cells shown in FIG. 7A.

FIG. 7A is a cross-sectional view of two antifuse OTP memory cells, one programmed and the other unprogrammed, according to the exemplary embodiment presented in FIG. 6. FIG. 7B is a schematic drawing of the two bit cells shown in FIG. 7A. The resistor $R_f$ 701 in FIG. 7B represents the resistance of the ohmic conductive path 611 between P$^+$ gate polysilicon 612 and P-type region 606 in FIG. 6. It is to be noted the resistor $R_f$ 701 is in the base of the BJT. The base current of a BJT is small—smaller than the emitter current by a factor given by the current gain- and therefore the voltage drop across the resistor $R_f$ 701 due to the base current is small. Consequently, for a fixed base-emitter bias voltage $V_{BE}$, the base-emitter junction voltage does not change significantly even if $R_f$ resistance varies from cell to cell. Since the emitter current is determined by the base-emitter junction voltage, the impact of cell-to-cell variation of $R_f$ resistance on the BJT emitter current is small. This is in contrast with the aforementioned U.S. Pat. No. 8,330,189 and U.S. Pat. No. 9,406,397. In the diode matrix memory array therein, diode series resistance is in the path of the read current, and therefore the cell-to-cell resistance variation can have a significant impact on the read current.

Figure 8:
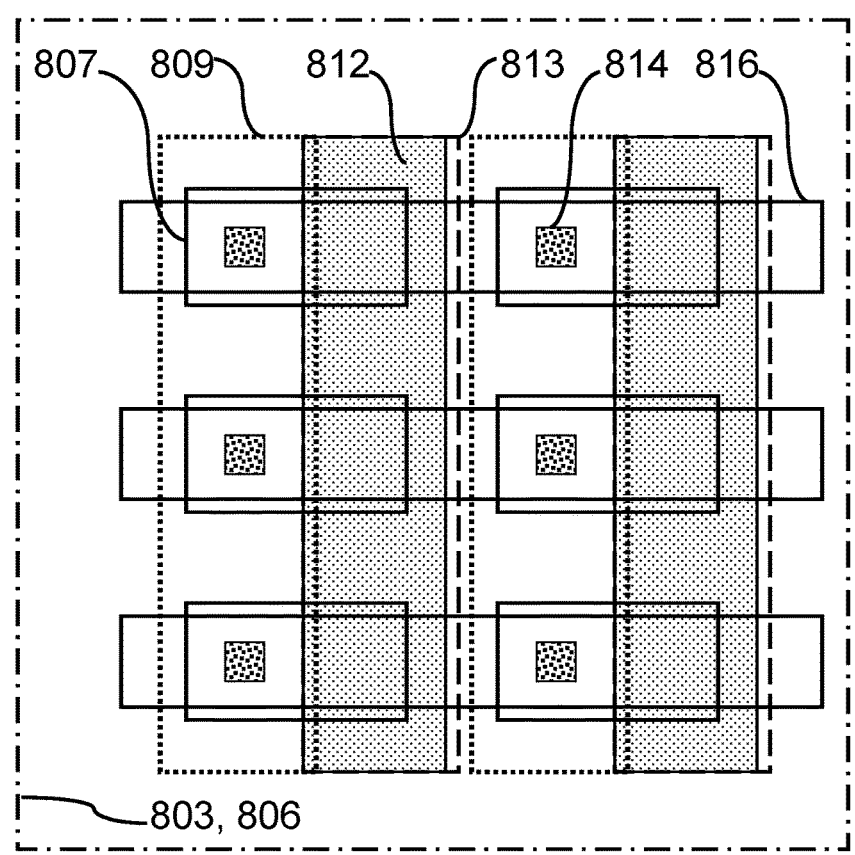
FIG. 8 is an exemplary layout of a memory array constructed with the exemplary embodiment of the present invention illustrated in FIG. 6.

FIG. 8 is an example layout of the exemplary embodiment of the present invention shown in FIG. 6. 807 is the mask pattern that defines the active area, or equivalently, the isolation structure 605. 812 is gate polysilicon, 814 is contact and 816 is the first-level metal. The broken lines 803, 806, 809 and 813 are the implant mask patterns for N-well 604, P-type region 606, N$^+$ source/drain implant and P$^+$ source/drain implant, respectively. It is to be noted in FIG. 8 N$^+$ source/drain implant pattern 809 overlaps with a portion of gate polysilicon 812. Having an overlap of N$^+$ source/drain implant pattern 809 with gate polysilicon 812 offers two advantages. One is it allows N$^+$ layer 608 to be aligned to the gate polysilicon edge so that the surface of N$^+$ layer 608 can be silicided as well as the surface of gate polysilicon 612. The other is gate polysilicon 812 is counter-doped by N$^+$ source/drain implant in the overlapped area, decreasing the net doping concentration in the gate polysilicon near the edge. This leads to an effectively thicker gate dielectric in the overlapped area and makes gate dielectric rupture take place in the safe area away from the gate edge.

Figure 9:
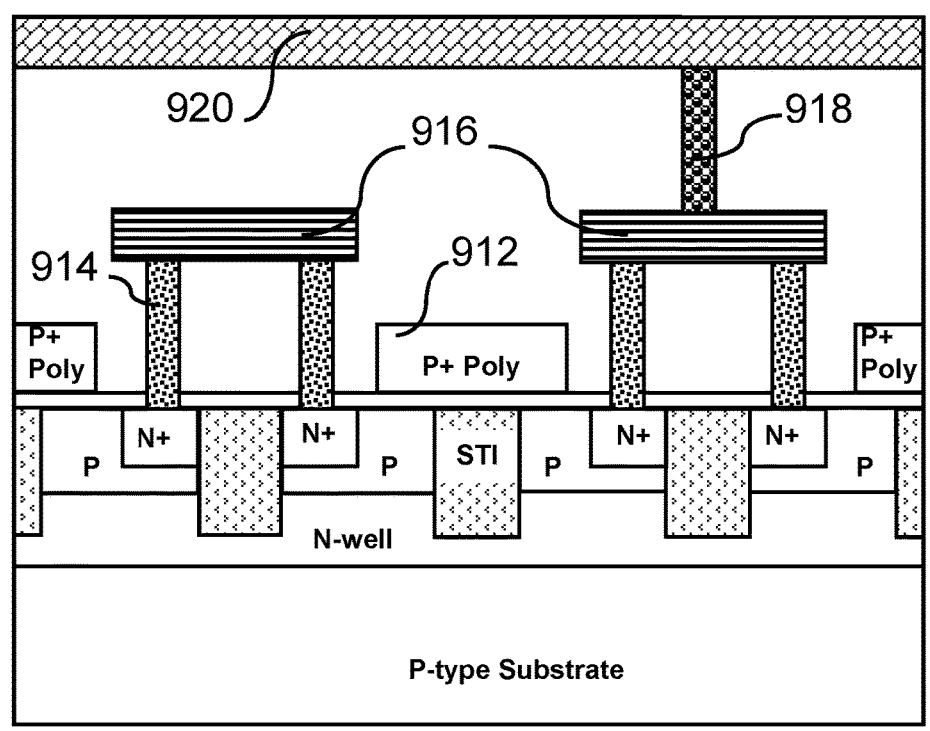
FIG. 9 is a cross-sectional view of another method of constructing a memory array with the exemplary embodiment of the present invention illustrated in FIG. 6.

FIG. 9 is a cross-sectional view of another method of connecting bit cells to metal bit lines using the exemplary embodiment shown in FIG. 6. It is to be noted each bit cell in FIG. 9 is a reflected version of neighboring bit cells. Two neighboring cells form a first pair and are connected to the same first metal bit line 916 through contacts 914. The next two neighboring cells form a second pair and share the first metal 916 that is used as a landing pad for a second contact 918 which is then connected to the second metal bit line 920. In this configuration, a bit cell is accessed by selecting either the first metal bit line or the second metal bit line and by selecting a word line. The advantage of the bit line connection scheme described in FIG. 9 in comparison to FIG. 8, wherein all bit lines are the first-level metal, is that the implant mask patterns are larger than the required minimum dimensions as is evident in FIG. 10.

Figure 10:
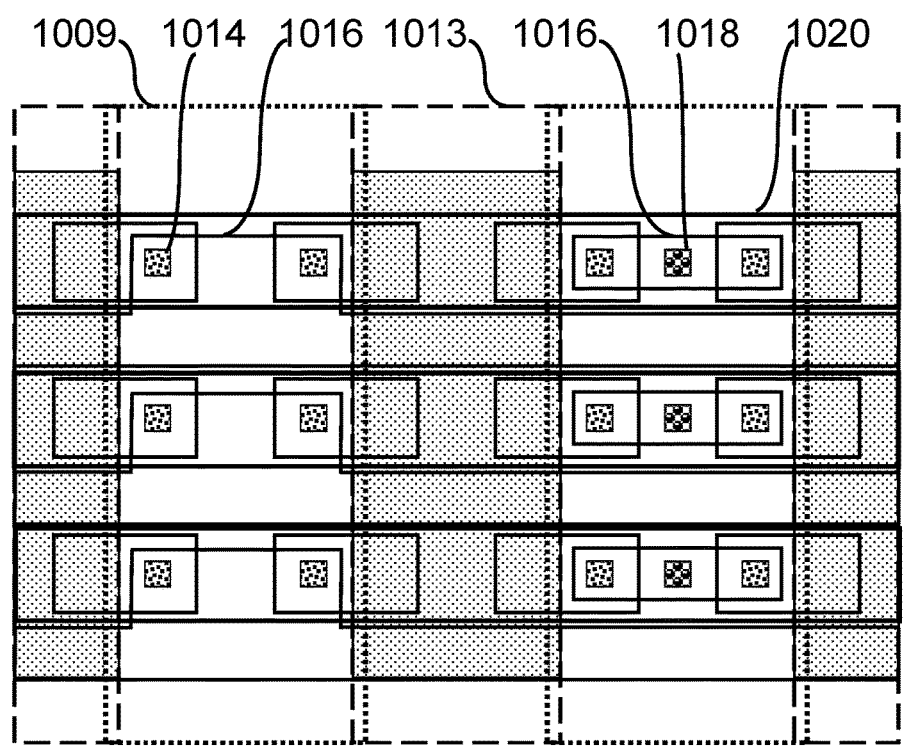
FIG. 10 is an exemplary layout of a memory array of which the cross-sectional view is shown in FIG. 9.

FIG. 10 is an exemplary layout of the bit line connection scheme presented in FIG. 9. 1014, 1016, 1018 and 1020 are contact, first metal, second contact and second metal, respectively. 1009 is the N⁺ source/drain implant mask pattern and 1013 is the P⁺ source/drain implant mask pattern. The width and spacing of both 1009 and 1013 are larger than those of FIG. 8 and larger than the required minimum dimensions, lowering the mask cost and improving manufacturability.

It is to be noted the orientation of word lines with respect to bit lines employed herein is for illustration purpose only. Those with ordinary skill in the art will recognize the word line and bit line may be laid out 90 degrees rotated, i.e., word line in the horizontal direction and bit line in the vertical direction. It should also be noted that the dimensions, horizontal and vertical, of the various parts of the antifuse OTP memory in the drawings of this disclosure, including the thickness of its various layers, depth and lateral reach of its doped regions are not necessarily drawn to scale. In some cases, layer thickness, junction depths, lengths and widths and other dimensions are exaggerated so as to best illustrate the structural features and/or functional aspects of the present invention. While various embodiments of the present invention have been described, it should be understood that they have been presented by way of example, and not limitation. It will be apparent to persons skilled in the relevant art that various changes in form and detail may be made therein without departing from the spirit and scope of the invention. The scope of the invention should, therefore, be determined not with reference to the above description, but instead by reference to the appended claims, along with the full scope of equivalents to which such claims are entitled.

What is claimed is:

1. A semiconductor one-time programmable (OTP) memory cell, electrically connected to a word line and a bit line, comprising an antifuse and a bipolar junction transistor (BJT):
    wherein said antifuse comprises a semiconductor active region of a first conductivity type, a dielectric layer formed on said semiconductor active region of the first conductivity type, and a gate electrode formed on said dielectric layer, wherein said gate electrode of the antifuse, when programmed, makes an ohmic contact to said semiconductor active region of the first conductivity type, wherein said semiconductor active region of the first conductivity type is the base, a semiconductor layer of a second conductivity type disposed inside said semiconductor active region of the first conductivity type is the emitter, a semiconductor layer of the second conductivity type disposed below said semiconductor active region of the first conductivity type is the collector of said BJT, wherein said gate electrode of the antifuse is electrically connected to the word line and the emitter of said BJT is electrically connected to the bit line.

2. The memory cell of claim 1 wherein the gate electrode of said antifuse is P-type polysilicon, said first conductivity type is P-type and said second conductivity type is N-type, or wherein the gate electrode of said antifuse is N-type polysilicon, said first conductivity type is N-type and said second conductivity type is P-type.

3. The memory cell of claim 1 wherein the gate electrode of said antifuse in a high-k metal gate (HKMG) process is gate metal of P-channel metal-oxide-semiconductor field-effect-transistor (MOSFET), said first conductivity type is P-type and said second conductivity type is N-type, or wherein the gate electrode of said antifuse in a HKMG process is gate metal of N-channel MOSFET, said first conductivity type is N-type and said second conductivity type is P-type.

4. The memory cell of claim 1 wherein a cell is read by applying voltages to the bit line, word line and collector of said bipolar junction transistor such that said bipolar junction transistor of a programmed cell operates in the forward active mode.

5. The memory cell of claim 1 wherein the bipolar junction transistor action is disabled in a selected cell during programming operation so that the programming current flows between the base and emitter terminals (word line and bit line, respectively) of said bipolar junction transistor.

6. The memory cell of claim 1 wherein said semiconductor active region of the first conductivity type or said semiconductor layers of the second conductivity type below said active region of the first conductivity type, or both are formed by extra processing steps not present in a standard CMOS manufacturing process.

* * * * *